United States Patent [19]
Matsuoka et al.

[11] Patent Number: 4,993,812
[45] Date of Patent: Feb. 19, 1991

[54] SEMICONDUCTOR LASER OPTICAL SYSTEM

[75] Inventors: Hiroshi Matsuoka; Hiroyuki Hiiro; Hidetoshi Shinada, all of Kanagawa, Japan

[73] Assignee: Fuji Photo Film Co., Ltd., Kanagawa, Japan

[21] Appl. No.: 216,919

[22] Filed: Jul. 7, 1988

[30] Foreign Application Priority Data

Jul. 8, 1987 [JP] Japan ................................. 62-170560

[51] Int. Cl.$^5$ .......................... G02B 5/30; G02B 27/28
[52] U.S. Cl. ...................................... 350/394; 350/401
[58] Field of Search ............... 350/169, 171, 172, 174, 350/401, 394, 383; 372/109

[56] References Cited

U.S. PATENT DOCUMENTS

| | | | |
|---|---|---|---|
| 4,170,401 | 10/1979 | Yoder, Jr. et al. | 350/174 |
| 4,370,026 | 1/1983 | Dubroeucq et al. | 350/174 |
| 4,776,678 | 10/1988 | Barthelemy et al. | 350/174 |
| 4,791,650 | 12/1988 | Tatsuno et al. | 350/401 |
| 4,822,151 | 4/1989 | Tatsuno et al. | 350/401 |

OTHER PUBLICATIONS

Scifres et al.; "Focusing of a 7700-Å High Power Phased Array Semiconductor Laser"; Applied Physics Letters 41 (12); Dec. 15, 1982; pp. 1121–1123.

*Primary Examiner*—Bruce Y. Arnold
*Assistant Examiner*—David R. Parsons
*Attorney, Agent, or Firm*—Sughrue, Mion, Zinn, Macpeak & Seas

[57] ABSTRACT

An optical system featuring a semiconductor laser for oscillating a beam which has, in a far field pattern, two lobes in the direction aligned with a pn junction interface of the semiconductor laser. The optical system is provided with a total reflection mirror for reflecting part of the beam in such a manner that one of the two lobes is separated as a result of the reflection of part of the beam from the other, and with a polarization beam splitter having a junction for synthesizing rays in such a manner that the lobes which have been separated by the total reflection mirror are superimposed. The apparatus is thus capable of forming a single beam spot at which the two lobes are superimposed.

19 Claims, 4 Drawing Sheets

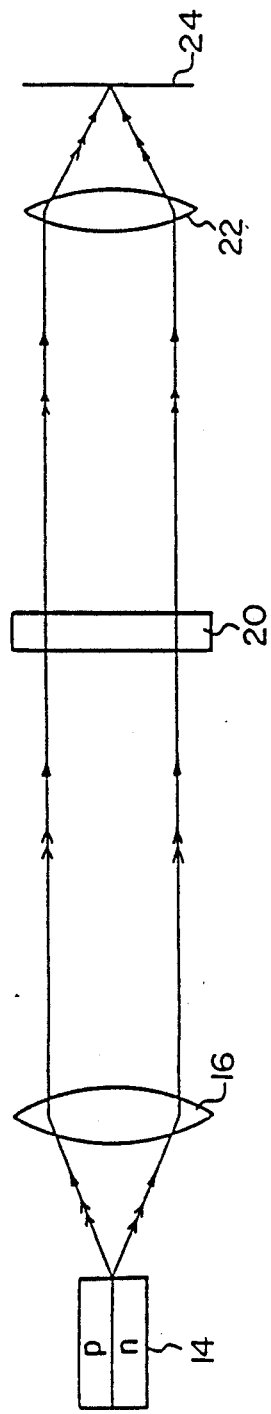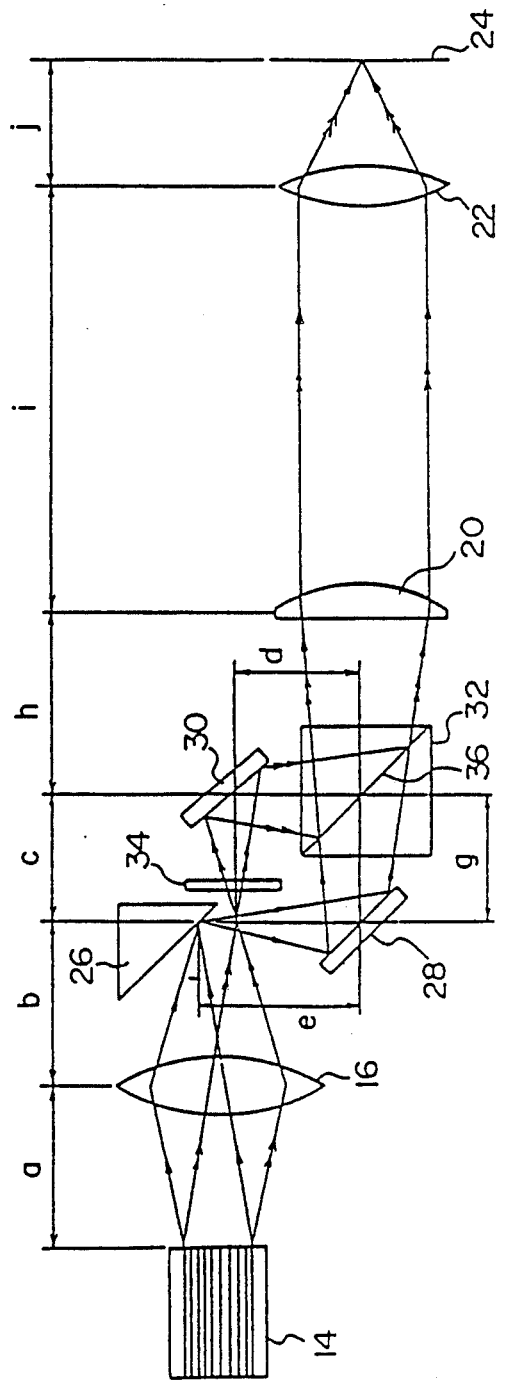

SEMICONDUCTOR LASER OPTICAL SYSTEM

BACKGROUND OF THE INVENTION

The present invention relates to a semiconductor laser optical system and, more particularly, to a phase synchronous semiconductor laser optical system suitable for use in recording information such as characters on a recording medium.

As shown in FIG. 2, a phase synchronous semiconductor laser is constructed as a multi-stripe type laser diode array having a multiple hetero-junction structure in which about several to ten stripe-shaped active layers 12 are arranged in rows along a pn junction interface 10. With this structure, the active layers 12 operate in basic transverse mode, and adjacent active layers 12 are connected on the energy level. As a result, laser beams which are oscillated by each active layer are synchronous in phase, thereby providing a high output. Semiconductor lasers of the above-described type include a series of products SDL-2410 and SDL-2420 (produced by Spectra Diode Labs). It is known that a laser beam oscillated by a semiconductor laser of the above-described type provides a far field pattern in which two lobes (peaks) are formed in the direction aligned with the pn junction interface, as shown in FIG. 3. Accordingly, a laser beam which forms such two lobes in a far field pattern does not converge into a single spot, and it is therefore impossible to compose an optical system having a high level of resolution if such a laser beam is used for recording information on a recording medium. A field pattern with two lobes presents a particular problem when it is required to record information such as characters on a microfilm in the form of dots, since, in this case, a resolution level on the order of 3360 dots/7.2 mm is required, and the dots must be recorded with a very high precision.

In order to cope with this problem, it has hitherto been proposed to render such a beam useful by cutting one of the lobes by means of an optical system shown in FIGS. 4A and 4B, in Appl. Phys. Lett. 41 (12), 15 Dec. 1982. This optical system comprises a phase synchronous semiconductor laser 14, a spherical lens 15, an aperture 18 extending in the direction intersecting the pn junction interface, a cylindrical lens 20 disposed in such a manner as to condense a beam oscillated in the direction aligned with the pn junction interface, and another spherical lens 21, these members being disposed in that order. As shown in FIG. 4A, rays oscillated by the phase synchronous semiconductor laser 14 in the direction intersecting the pn junction surface are made into parallel rays by the first spherical lens 15, pass through the aperture 18 and the cylindrical lens 20, and are then converged by the second spherical lens 22 onto a recording medium 24 to form a spot. On the other hand, as shown in FIG. 4B, rays oscillated in the direction aligned with the pn junction interface are converged by the spherical lens 15 onto a focus point at the aperture 18, and a clear far field pattern is formed at the position of this focus. The aperture 18 passes only the rays that form one of the lobes and blocks the rays that form the other. The rays which have passed through the aperture 18 are made into parallel rays by the cylindrical lens 20, and are then converged by the spherical lens 22 onto the recording medium 24 to form a spot. Accordingly, a clear spot having a diameter of several $\mu$m is formed on the recording medium 24.

With the above-described known optical system, however, the following problem is encountered. Since part of the beam which forms one of the lobe is cut, the intensity of the laser beam part oscillated in the direction aligned with the pn junction interface is reduced to a level of about ½ of that of the total laser beam part, thus resulting in a reduced efficiency. This feature of the optical system renders difficult its application to recording using a recording medium requiring a high energy for recording, such as a heat mode recording material.

Japanese Patent Laid-Open No. 98320/1987 discloses a proposal in which, after a laser beam has been collimated into a bundle of parallel rays, rays forming two lobes are separated, and the two lobes are then unified by means of a reflection mirror, a half-wave plate, and a polarization beam splitter. In practice, however, it is difficult to obtain completely parallel rays with a laser according to the above-stated proposal. If the optical path of the separated rays forming one lobe is not completely equal with that of the separated rays forming the other, then when the rays are condensed by the final lens, the position of the beam waist deviates from the optical axis. This makes it difficult to converge the beam at a high energy density.

SUMMARY OF THE INVENTION

In order to solve the problems of the prior art, it is an object of the present invention to provide an optical system which is capable of minimizing the energy loss of a laser beam oscillated by a phase synchronous semiconductor laser, and which is thus capable of forming a clear laser beam spot.

To this end, according to the present invention, there is provided a semiconductor laser optical system comprising: a semiconductor laser for oscillating a beam which has, in a far field pattern, two lobes in the direction aligned with a pn junction interface of the semiconductor laser; a first lens for collimating first rays which have been oscillated by the semiconductor laser in the direction intersecting the pn junction interface and for converging second rays which have been oscillated by the semiconductor laser in the direction aligned with the pn junction interface; separating means for separating the second rays in such a manner that the two lobes formed on focal positions of the first lens are separated; synthesizing means for synthesizing rays which have been separated by the separating means, in such a manner that the two lobes are superimposed; a second lens for collimating rays which have been synthesized by the synthesizing means and which oscillate in the direction aligned with the pn junction interface; and a third lens for converging rays which have passed through the second lens.

According to the present invention, rays which have been oscillated by the semiconductor laser in the direction intersecting the pn junction interface are collimated by the first lens, propagate rectilinearly through the second lens, and are then converged by the third lens. On the other hand, rays which have been oscillated by the semiconductor laser in the direction aligned with the pn junction interface are subjected to Fourier transformation by the first lens so as to form a clear far field pattern having two lobes at focal positions of the first lens. The separating means separates the second rays in such a manner that the two lobes formed on the focal position of the first lens are separated. Rays which have been separated are synthesized by the synthesizing means in such a manner that the two lobes are superimposed. Rays which have been synthesized are again subjected to Fourier transformation by the second lens so as to form a near field pattern on the focal position of the second lens. These rays are then subjected to Fourier transformation by the third (spherical) lens so as to form a far field pattern (i.e., a single spot on which the two lobes are superimposed) which is synthesized on the focal position of the third lens.

As described above, according to the present invention, after a clear far field pattern having two lobes has been formed and after these lobes have been separated, rays are synthesized in such a manner that the lobes are superimposed. Therefore, a clear spot can be formed with a minimum energy loss of the oscillated laser beam.

In carrying out the present invention, the following arrangements may be adopted.

In a first arrangement, the oscillating portion of the semiconductor laser is disposed in such a manner as to be positioned at the primary focal point of the first lens, and, simultaneously, the separating means is disposed at or in the vicinity of the secondary focal point of the first lens for separating the lobes. Part of the laser beam which has been oscillated by the semiconductor laser is subjected to Fourier transformation by the first lens to form a clear far field pattern at or in the vicinity of the position of the secondary focal point of the first lens. With the first arrangement, therefore, the lobes can be separated with ease.

In a second arrangement, the optical paths from the separating means to the synthesizing means of two bundles of rays which have been separated by the separating means are made equal to each other. With these optical paths equalized, it is possible to prevent the beam waist from deviating with respect to the optical axis when, after the separated rays have been synthesized, the rays are converged by the third lens.

In a third arrangement, the second lens is disposed in such a manner that the optical path from the separating means to the second lens are equal to the focal length of the second lens. With the second lens disposed in this way; it is possible to form a near field pattern at the focal position of the second lens by Fourier transformation by the second lens.

In a fourth arrangement, the optical path from the second lens to the third lens is made equal to the sum of the focal length of the second lens and the focal length of the third lens. This arrangement enables the formation of a far field pattern which is synthesized on the focal position of the third lens by the Fourier transformation by the third lens.

A semiconductor laser of the phase synchronous type may be used as the semiconductor laser. A cylindrical lens may be used as the second lens.

BRIEF DESCRIPTION OF THE DRAWINGS

FIGS. 1A and 1B are respectively a plan view and a front view of an optical system in accordance with one embodiment of the present invention;

PREFERRED EMBODIMENT OF THE PRESENT INVENTION

Figure 2:
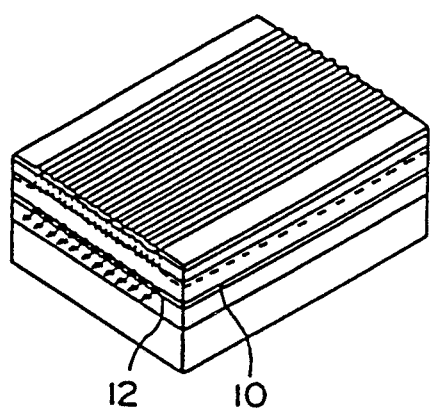
FIG. 2 is a perspective view showing the exterior appearance of a phase synchronous semiconductor laser.
Figure 3:
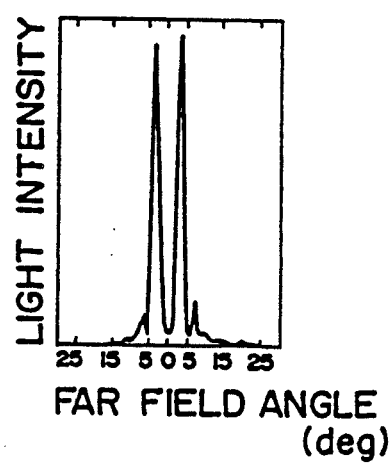
FIG. 3 is a graph showing a far field pattern.
Figure 4A:
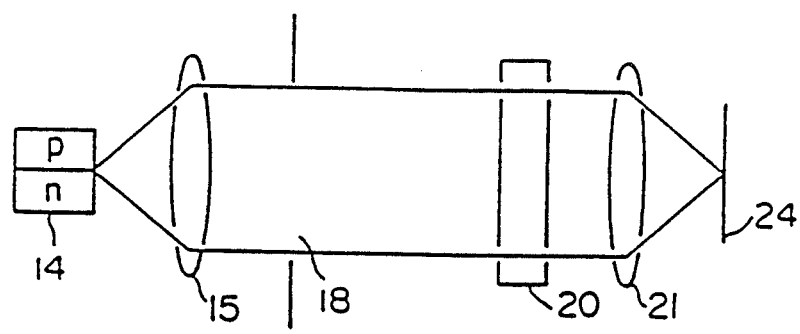
FIGS. 4A and 4B are respectively a plan view and a front view of a known optical system.
Figure 4B:
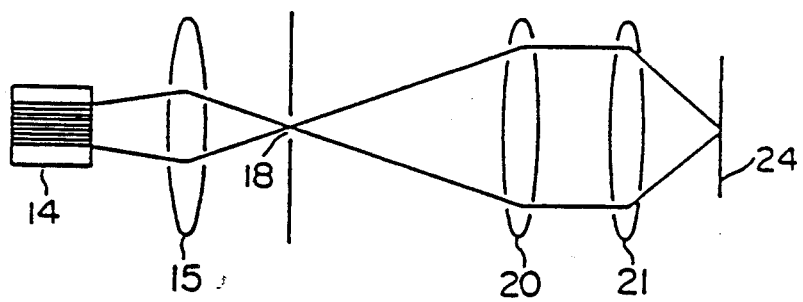

One embodiment of the present invention will be described hereunder in detail with reference to the drawings. FIGS. 1A and 1B illustrate an optical system in accordance with one embodiment of the present invention. FIG. 1A is a plan view of the optical system, in which the illustration of a separating means and a synthesizing means of the system is omitted. FIG. 1B is a front view of the optical system. On one side of a phase synchronous semiconductor laser 14 from which a laser beam is oscillated, a lens 16 is disposed at a position with which rays which have been oscillated by the semiconductor laser 14 in the direction intersecting a pn junction interface of the semiconductor laser 14 are made parallel by the lens 16. (These rays are hereafter referred to as "perpendicular rays"). Rays which have been oscillated by the semiconductor laser 14 in the direction aligned with the pn junction interface (these rays being hereafter referred to as "horizontal rays") are converged onto focal positions of the lens 16 which are determined by the formulas of the lens. This is because the horizontal rays have been oscillated at a radiation angle smaller than that of the perpendicular rays, as shown in FIGS. 1A and 1B, and because the lens 16 is disposed at the position with which the perpendicular rays are collimated, that is, the lens 16 is disposed in such a manner that the phase synchronous semiconductor laser 14 is positioned at the primary focal point of the lens 16.

A total reflection mirror 26 having a triangular section and having a reflection surface defined by the hypotenuse is disposed at a position corresponding to the focal point of the lens 16. The mirror 26 has a knife-edge shaped tip portion. The tip portion of the mirror 26 reflects only part of the horizontal rays in such a manner as to separate two lobes formed by the lens 16 in a far field pattern. Also disposed in the optical system are a total reflection mirror 28 for reflecting the rays which have been reflected by the total reflection mirror 26, toward a junction 36 of a polarization beam splitter 32, and a total reflection mirror 30 for reflecting rays which have not been reflected by the total reflection mirror 26, toward the junction 36 of the polarization beam splitter 32. A half-wave plate 34 is disposed between the total reflection mirrors 26 and 30. On the laser beam radiation side of the polarized beam splitter 32, a cylindrical lens 20 is disposed at a position with which the horizontal rays are made parallel, that is, the lens 20 is disposed in such a manner that the optical path from the total reflection mirror 26 to the cylindrical lens 20 is equal to the focal length of the cylindrical lens 20. Therefore, the perpendicular rays rectilinearly propagates through the cylindrical lens 20. A further lens 22 is disposed on the laser beam radiation side of the cylindrical lens 20. The lens 22 is disposed in such a manner that the focal point of the lens 22 is superimposed on that of the cylindrical lens 20.

The above-described optical elements are disposed in such a manner as to satisfy the following formulas (1) to (5) if it is assumed that a to j represent the following:

a: the optical path from the oscillating portion of the phase synchronous semiconductor laser 14 to the lens 16;

b: the optical path from the lens 16 to the reflection point of the total reflection mirror 26;

c: the optical path from the focal position to the total reflection mirror 30 of the rays which have not been reflected by the total reflection mirror 26;

d: the optical path from the total reflection mirror 30 to the junction 36;

e: the optical path from the total reflection mirror 26 to the total reflection mirror 28;

f1: the focal length of the lens 16;

f2: the focal length of the lens 22;

fCYL: the focal length of the cylindrical lens 20;

g: the optical path from the total reflection mirror 28 to the junction 36;

h: the optical path from the junction 36 to the cylindrical lens 20;

i: the optical path from the cylindrical lens 20 to the lens 22; and j: the optical path from the lens 22 to a recording medium $$a = b = f1 \quad \ldots (1)$$
$$c + d = e + g \quad \ldots (2)$$
$$c + d + h = e + g + h = fCYL \quad \ldots (3)$$
$$i = fCYL + f2 \quad \ldots (4)$$
$$j = f2 \quad \ldots (5)$$

Next, the operation of the optical system in accordance with the present invention will be described. As shown in FIG. 1A, the perpendicular rays which have been oscillated by the phase synchronous semiconductor laser 14 are made parallel by the lens 16, rectilinearly propagate through the cylindrical lens 20, and are then converged by the lens 22 onto the recording media 24 to form a spot thereon.

As shown in FIG. 2B, the horizontal rays which have been oscillated by the phase synchronous semiconductor laser 14 are converged by the lens 16 to form, by Fourier transformation, a clear far field pattern having two lobes on the focal point of the lens 16. Part of the horizontal rays forming one of the lobes are reflected by the total reflection mirror 26 serving as a separating means whereby this part of the horizontal rays are separated from the remaining rays forming the other lobe. The rays reflected by the total reflection mirror 26 are reflected by the total reflection mirror 28 toward the polarization beam splitter 32. At this point, this part of the horizontal rays is p-polarized light with respect to the surface of FIG. 1B. Therefore, the rays reflected by the total reflection mirror 28 transmit through the polarization beam splitter 32. On the other hand, rays which have not been reflected by the total reflection mirror 26 pass the half-wave plate 34 to become s-polarized light, are reflected by the total reflection mirror 30, and are then reflected by the junction 36 of the polarization beam splitter 32. Thus, the rays which have been transmitted through the polarization beam splitter 32 and the rays which have been reflected by the junction 36 become a bundle of synthesized rays having a common optical axis. The synthesized rays are made parallel by the cylindrical lens 20. Thereafter, the rays form, by Fourier transformation, a near field pattern having, e.g. ten, stripes at the focal position of the cylindrical lens 20. Thereafter, the rays are converged by the lens 22, which is disposed in such a manner as to have its focal point superimposed with that of the cylindrical lens 20, onto the recording medium 24 to form a synthesized far field pattern thereon.

In consequence, the horizontal rays and the perpendicular rays are converged by the lens 22 to form spots at the same position.

Figures 5A, 5B:
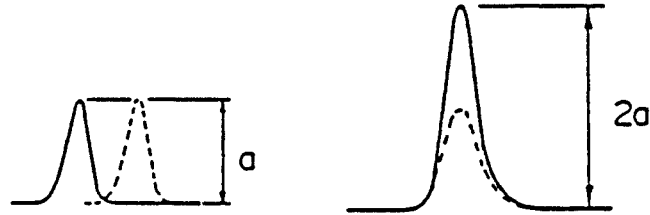
FIGS. 5A and 5B are illustrations showing the light intensity of the present invention and that of the prior art for the purpose of comparison.

FIGS. 5A and 5B are illustrations useful in comparing the intensity of the horizontal rays obtained with the optical apparatus of the present invention with that of the horizontal rays obtainable with the prior art in which one of the lobes is cut. The intensity of the rays (shown in FIG. 5B) provided by the apparatus of the present invention is approximately two times that of the rays (shown in FIG. 5A) provided by the prior art.

As described above, according to the present invention, by use of the Fourier transformation action of the first lens, a clear far field pattern is formed, and rays providing these lobes are separated in such a manner that the lobes are separated. Thereafter, the rays are synthesized in such a manner that the lobes are superimposed. Since the optical paths of the two bundles of separated rays from the separating means to the synthesizing means are equal, spots corresponding to the lobes are prevented from deviating from the optical axis. After the separation of the lobes, since a near field pattern and a far field pattern are formed in relays by use of the Fourier transformation action of the lenses, it is possible to form a clear synthesized far field pattern on the converging point after the rays have been transmitted through the second lens. Thus, the present invention provides the effect of forming a clear spot with a minimum energy loss of a laser beam having two lobes in a far field pattern.

Although in the foregoing embodiment, the semiconductor laser consists of a phase synchronous semiconductor laser, &his is a mere example. A semiconductor laser of a broad-contact type may alternatively be used in the optical system of the present invention.

Needless to say, the focal positions in the optical system of the present invention include not only theoretical focal points but also positions in the vicinity of the focal points which are within an allowable range in terms of the performance and functions of the system of the present invention.

What is claimed is:

1. A semiconductor laser optical system comprising:
a semiconductor laser for oscillating a beam which has, in a far field pattern, first and second lobes in the direction aligned with a pn junction interface of said semiconductor laser;

a first lens for collimating first rays which have been oscillated by said semiconductor laser in the direction intersecting said pn junction interface and for converging at separate focal positions second rays forming said first and second lobes, respectively, which have been oscillated by said semiconductor laser in the direction aligned with said pn junction interface;

separating means for separating said second rays in such a manner that said first and second lobes formed on focal positions of said first lens are separated;

synthesizing means for synthesizing said second rays which have been separated by said separating means, in such a manner that said first and second lobes are superimposed;

a second lens for collimating rays which have been synthesized by said synthesizing means and which oscillate in the direction aligned with said pn junction interface; and a third lens for converging rays which have passed through said second lens.

2. A semiconductor laser optical system according to claim 1, wherein said semiconductor laser has an oscillating portion disposed at one focal point of said first lens on one side thereof and, simultaneously, said separating means is disposed at or in the vicinity of the other focal point of said first lens on the other side thereof for separating said two lobes.

3. A semiconductor laser optical system according to claim 2, wherein said synthesizing means is disposed in such a manner that the optical paths from said separating means to said synthesizing means of two bundles of rays which have been separated by said separating means are equal to each other.

4. A semiconductor laser optical system according to claim 3, wherein said second lens is disposed in such a manner that the optical path from said separating means to said second lens is equal to the focal length of said second lens.

5. A semiconductor laser optical system according to claim 4, wherein said third lens is disposed in such a manner that the optical path from said second lens to said third lens is equal to the sum of the focal length of said second lens and the focal length of said third lens.

6. A semiconductor laser optical system according to claim 1, wherein said separating means comprises reflecting means for reflecting only part of said second rays in such a manner that one of said first and second lobes is separated from the other.

7. A semiconductor laser optical system, comprising:

a semiconductor laser for oscillating a beam which has, in a far field pattern, two lobes in the direction aligned with a pn junction interface of said semiconductor laser;

a first lens for collimating first rays which have been oscillated by said semiconductor laser in the direction intersecting said pn junction interface and for converging second rays which have been oscillated by said semiconductor laser in the direction aligned with said pn junction interface;

separating means for separating said second rays in such a manner that said two lobes formed on focal positions of said first lens are separated, said separating means being comprised of reflecting means for reflecting only part of said second rays, in such a manner that one of said two lobes is separated from the other;

synthesizing means for synthesizing rays which have been separated by said separating means, in such a manner that said two lobes are superimposed;

a second lens for collimating rays which have been synthesized by said synthesizing means and which oscillate in the direction aligned with said pn junction interface; and a third lens for converging rays which have passed through said second lens;

wherein said reflecting means comprises a first total reflection mirror having a tip portion with a knife-edge shaped section, said first total reflection mirror being disposed in such a manner that the reflection of said part of said second rays is effected by said tip portion.

8. A semiconductor laser optical system according to claim 7, wherein said synthesizing means comprises a polarization beam splitter capable of synthesizing at a junction thereof said two bundles of rays which have been separated and also capable of making the thus synthesized rays emerge toward said second lens.

9. A semiconductor laser optical system according to claim 8, wherein said synthesizing means further comprises a second total reflection mirror for reflecting one of said two bundles of separated rays and for making said one of said bundles of rays incident onto said junction of said polarization beam splitter from one side of said junction, a half-wave plate through which the other of said two bundles of separated rays pass, and a third total reflection mirror for reflecting said other bundle of rays which have passed through said half-wave plate and for making said other bundle of rays incident onto said junction of said polarization beam splitter from the other side of said junction.

10. A semiconductor laser optical system according to claim 9, wherein the elements of said system are disposed in such a manner as to satisfy the following formulas (1) to (5):

| | |
|---|---|
| a = b = f1 | ... (1) |
| c + d = e + g | ... (2) |
| c + d + h = e + g + h = fCYL | ... (3) |
| i = fCYL + f2 | ... (4) |
| j = f2 | ... (5) |

(where, a: the optical path from said oscillating portion of said semiconductor laser to said first lens;

b: the optical path from said first lens to the reflection point of said first reflection mirror;

c: the optical path from the focal position to said third reflection mirror of rays which have not been reflected by said first reflection mirror;

d: the optical path from said third reflection mirror to said junction of said polarization beam splitter;

e: the optical path from the reflection point of said first reflection mirror to said second reflection mirror;

f1: the focal length of said first lens;

f2: the focal length of said third lens;

fCYL: the focal length of said second lens;

g: the optical path from said second reflection mirror to said junction of said polarization beam splitter;

h: the optical path from said junction of said polarization beam splitter to said second lens;

i: the optical path from said second lens to said third lens; and j: the optical path from said third lens to a point at which said rays transmitted through said second lens are converged by said third lens).

11. A phase synchronous semiconductor laser optical system for use in recording of information on a recording medium, comprising:

a phase synchronous semiconductor laser for oscillating a beam which has, in a far field pattern, first and second lobes in the direction aligned with a pn junction interface of said phase synchronous semiconductor laser;

a first lens for collimating first rays which have been oscillated by said phase synchronous semiconductor laser in the direction intersecting said pn junction interface and for converging at separate focal positions second rays forming said first and second lobes, respectively, which have been oscillated by said phase synchronous semiconductor laser in the direction aligned with said pn junction interface;

reflecting means for reflecting part of said second rays in such a manner that one of said first and second lobes formed on focal positions of said first lens is separated from the other;

synthesizing means for synthesizing said second rays which have been reflected by said reflecting means, in such a manner that said first and second lobes are superimposed;

a cylindrical lens for collimating rays which have been synthesized by said synthesizing means and which oscillate in the direction aligned with said pn junction interface; and a second lens for converging rays which have passed through said cylindrical lens.

12. A phase synchronous semiconductor laser optical system according to claim 11, wherein said phase synchronous semiconductor laser has an oscillating portion disposed at one focal point of said first lens on one side thereof and, simultaneously, said reflecting means is disposed at or in the vicinity of the other focal point of said first lens on the other side thereof for separating said second rays in such a manner that said one of said two lobes is separated from the other.

13. A phase synchronous semiconductor laser optical system according to claim 12, wherein said synthesizing means is disposed in such a manner that the optical paths from said reflecting means to said synthesizing means of two bundles of rays which have been separated by said reflecting means are equal to each other.

14. A phase synchronous semiconductor laser optical system according to claim 13, wherein said cylindrical lens is disposed in such a manner that the optical path from said reflecting means to said cylindrical lens is equal to the focal length of said cylindrical lens.

15. A phase synchronous semiconductor laser optical system according to claim 14, wherein said second lens is disposed in such a manner that the optical path from said cylindrical lens to said second lens is equal to the sum of the focal length of said cylindrical lens and the focal length of said second lens.

16. A phase synchronous semiconductor laser optical system for use in recording of information on a recording medium, comprising:

a phase synchronous semiconductor laser for oscillating a beam which has, in a far field pattern, two lobes in the direction aligned with a pn junction interface of said phase synchronous semiconductor laser;

a first lens for collimating first rays which have been oscillated by said phase synchronous semiconductor laser in the direction intersecting said pn junction interface and for converging second rays which have been oscillated by said phase synchronous semiconductor laser in the direction aligned with said pn junction interface;

reflecting means for reflecting part of said second rays in such a manner that one of said two lobes formed on focal positions of said first lens is separated from the other;

synthesizing means for synthesizing rays which have been separated by said reflecting means, in such a manner that said two lobes are superimposed;

a cylindrical lens for collimating rays which have been synthesized by said synthesizing means and which oscillate in the direction aligned with said pn junction interface; and a second lens for converging rays which have passed through said cylindrical lens;

wherein said reflecting means comprises a first total reflection mirror having a tip portion with a knife-edge shaped section, said first total reflection mirror being disposed in such a manner that the reflection of said part of said second rays is effected by said tip portion.

17. A phase synchronous semiconductor laser optical system according to claim 16, wherein said synthesizing means comprises a polarization beam splitter capable of synthesizing at a junction thereof said two bundles of rays which have been separated and also capable of making the thus synthesized rays emerge toward said cylindrical lens.

18. A phase synchronous semiconductor laser optical system according to claim 17, wherein said synthesizing means further comprises a second total reflection mirror for reflecting one of said two bundles of separated rays and for making said one of said bundles of rays incident onto said junction of said polarization beam splitter from one side of said junction, a half-wave plate through which the other of said two bundles of separated rays pass, and a third total reflection mirror for reflecting said other bundle of rays which have passed through said half-wave plate and for making said other bundle of rays incident onto said junction of said polarization beam splitter from the other side of said junction.

19. A phase synchronous semiconductor laser optical system according to claim 18, wherein the elements of said system are disposed in such a manner as to satisfy the following formulas (1) to (5):

| | |
|---|---|
| $a = b = f1$ | ... (1) |
| $c + d = e + g$ | ... (2) |
| $c + d + h = e + g + h = fCYL$ | ... (3) |
| $i = fCYL + f2$ | ... (4) |
| $j = f2$ | ... (5) |

(where, a: the optical path from said oscillating portion of said phase synchronous semiconductor laser to said first lens;

b: the optical path from said first lens to the reflection point of said first total reflection mirror;

c: the optical path from the focal position to said third total reflection mirror of said rays which have not been reflected by said first total reflection mirror;

d: the optical path from said third total reflection mirror to said junction;

e: the optical path from the reflection point of said first total reflection mirror to said second total reflection mirror;

f1: the focal length of said first lens;

f2: the focal length of said second lens;

fCYL: the focal length of said cylindrical lens;

g: the optical length from said second total reflection mirror to said junction;

h: the optical path from said junction to said cylindrical lens;

i: the optical path from said cylindrical lens to said second lens; and j: the optical path from said second lens to said recording medium).

* * * * *